United States Patent [19]
Payne et al.

[11] 3,979,611
[45] Sept. 7, 1976

[54] TRANSISTOR SWITCHING CIRCUIT

[75] Inventors: Michael Ian Payne, Dunellen; Bhadrik Subodhchandra Dalal, Piscataway, both of N.J.

[73] Assignee: RCA Corporation, New York, N.Y.

[22] Filed: Feb. 6, 1975

[21] Appl. No.: 547,634

[52] U.S. Cl. ............................ 307/300; 307/218; 307/317 A
[51] Int. Cl.² ........................................ H03K 17/00
[58] Field of Search ........ 307/300, 317 A, 254–255, 307/214–218

[56] References Cited
UNITED STATES PATENTS

| | | | |
|---|---|---|---|
| 3,482,111 | 12/1969 | Gunderson et al. | 307/300 |
| 3,654,486 | 4/1972 | Cubert | 307/300 |
| 3,836,792 | 9/1974 | Eckert et al. | 307/300 |
| 3,867,644 | 2/1975 | Cline | 307/317 A |
| R27,804 | 10/1973 | Treadway | 307/300 |

*Primary Examiner*—Stanley D. Miller, Jr.
*Assistant Examiner*—B. P. Davis
*Attorney, Agent, or Firm*—H. Christoffersen; H. I. Schanzer

[57] ABSTRACT

A switching circuit includes an offset PN junction serially connected to the base of a transistor. In response to an input signal transition for turning off the transistor, a voltage responsive to the signal transition is coupled through the capacitance of the PN junction to the base of the transistor for turning it off. A unidirectionally conducting element connected between the base and a point of potential conducts in the forward direction, in response to the turn off voltage at the base, and prevents the base-to-emitter voltage of the transistor from going substantially below the turn on level of the transistor. The response time of the transistor to a subsequent turn-on input signal is thereby decreased.

8 Claims, 3 Drawing Figures

TRANSISTOR SWITCHING CIRCUIT

STATEMENT

The invention herein described was made in the course of or under a contract (or subcontract thereunder, or grant) with the Department of the Navy.

This invention relates to semiconductor switching circuits and in particular to an improved circuit in which the speed of response of a semiconductor switching circuit is increased.

The invention is best explained and understood by reference to the accompanying drawings in which like reference characters denote like components and in which FIG. 1 is a schematic diagram of a circuit illustrating the problem faced by Applicant;

Figure 1:
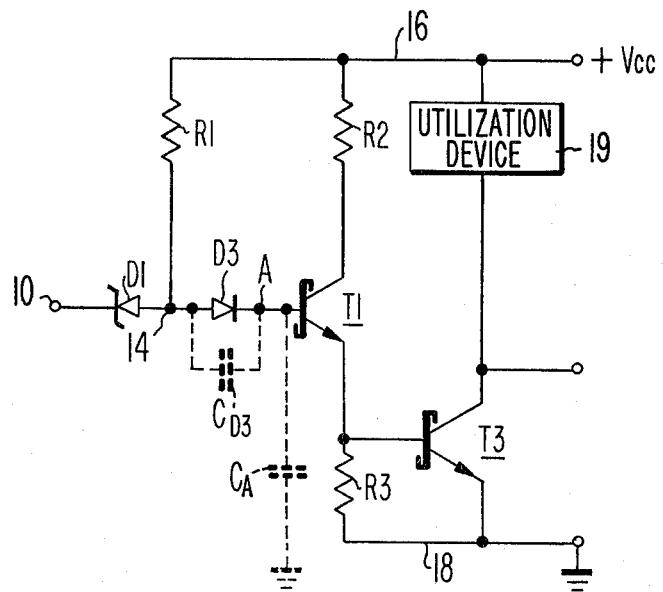

The circuit of FIG. 1 includes a signal input terminal 10 and a Schottky diode D1 connected between node 14 and terminal 10 and poled in a direction to conduct current from node 14 into node 10. A resistor R1 is connected between node 14 and conductor 16 to which is applied +$V_{CC}$ volts. A conventional diode D3 is connected at its anode to node 14 and at its cathode to node A at the base of transistor T1. A resistor R2 is connected between the collector of transistor T1 and conductor 16. The emitter of transistor T1 is connected to one end of resistor R3 and to the base of transistor T3. The other end of resistor R3 and the emitter of transistor T3 are connected to conductor 18 to which is applied ground potential. The collector of transistor T3 is connected through utilization device 19 to conductor 16.

Figure 2:
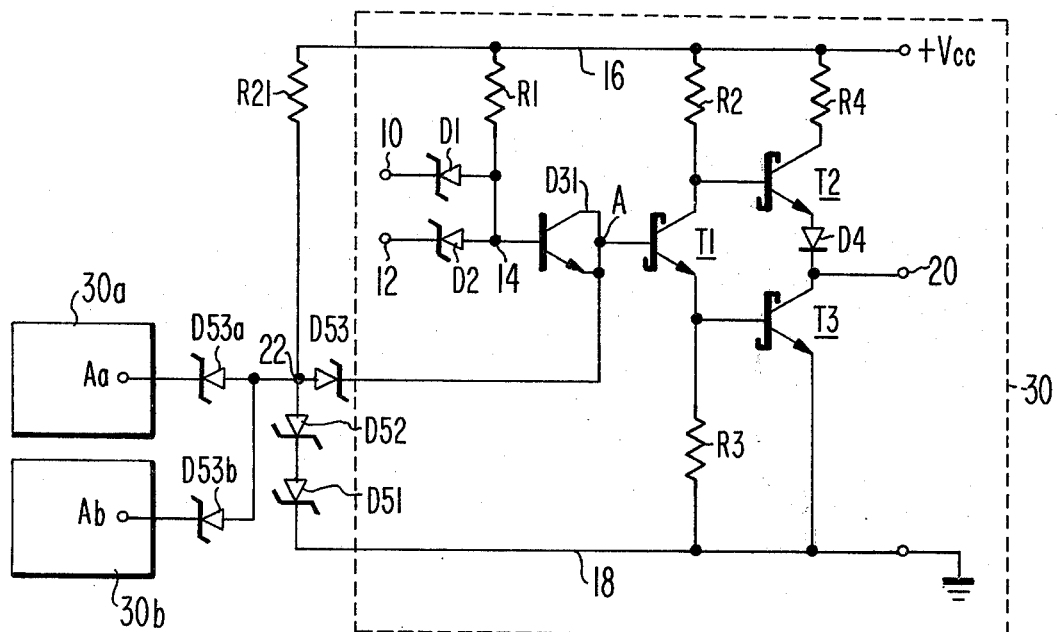
FIG. 2 is a schematic diagram of a circuit embodying the invention.

To better understand the operation of the circuits of FIGS. 1 and 2, the following definitions and assumptions are noted:

Transistors T1 and T3 each have a Schottky barrier diode formed between their base and collector to prevent these transistors from being driven deeply into saturation. Accordingly, it is assumed that (when transistors T1 or T3 are turned on hard) the minimum collector-to-emitter voltage of these transistors is of the order of 0.25 volt. Diode D1 and any other Schottky diode are assumed to have a forward drop ($V_{FS}$) of 0.55 volt. The forward drop ($V_F$) of a conventional diode (PN junction) and the forward base-to-emitter voltage drop ($V_{BE}$) of the transistors used in the circuit are assumed to be equal to 0.8 volt. It should also be noted that conventional diodes or PN junctions exhibit some diffusion and depletion capacitance when reverse biased (or when being reverse biased) as compared to Schottky barrier diodes which exhibit very little junction capacitance. As used herein the terms "unidirectional conducting element", "diode" or "rectifying junctions" are meant to include PN junctions and Schottky barrier diodes. The terms "PN junction" or "conventional diode" are meant to exclude Schottky diodes.

The amplitude of the input signal applied to terminal 10 normally varies between +$V_{CC}$ volts and ground potential. In this application, a potential at, or near, ground is arbitrarily defined as a logic 0 or "low" condition and any potential at or near +$V_{CC}$ is arbitrarily defined as a logic 1 or "high" condition. For ease of explanation, it may be assumed that a "low" input signal has a voltage level of 0.25 volt.

In the circuit of FIG. 1, when the input signal is high, current flows through resistor R1 and through diode D3 into the base of transistor T1. Transistor T1 conducts and its emitter current is supplied to the base of transistor T3, driving it into saturation and thereby causing the potential at its collector to be clamped close to ground potential. When the input signal ($V_{IN}$) applied to terminal 10 is high, the voltage at node 14 is at 3$V_{BE}$ volts and the voltage at node A is at 2$V_{BE}$ volts as shown in waveforms A, B and C of FIG. 3.

Diode D3 functions as an offset diode to increase the noise immunity of the circuit. In the absence of diode D3, (if D3 were replaced by a short circuit), transistors T1 and T3 would turn on when the potential at node 14 would exceed 2$V_{BE}$ volts. Due to the forward voltage drop across diode D3, the input signal must reach a predetermined amplitude (3$V_{BE}$ volts) before transistor T3 is turned on. Noise or extraneous signals below the predetermined amplitude (3$V_{BE}$ volts) do not cause the transistor switch T1 to turn on.

The capacitance of PN junction (i.e. non-Schottky) diode D3 is used to turn off transistor T1. When the input signal at terminal 10 goes low (0.25 volt) the potential at node 14 goes from 3$V_{BE}$ volts to $V_{FS}$ volts above the low at terminal 10. Since $V_{FS}$ is assumed to be approximately equal to 0.55 volt, the potential at node 14 drops from 3$V_{BE}$ volts to 0.8 volt ($V_{BE}$). This negative voltage drop tends to reverse bias diode D3 and is coupled through its capacitance to the base of transistor T1. As a result, the potential at the base of transistor T1 is driven from 2$V_{BE}$ volts to ground potential as shown in waveform C of FIG. 3. Transistor T1 cuts off and no longer supplies current to the base of transistor T3, which also cuts off. With reference to FIG. 1, Applicants' invention resides, in part, in the recognition that the relatively large negative transition applied to the base of transistor T1 increases the turn-on delay time of the circuit. The potential at the base of transistor T1 must be charged from zero volts to 2$V_{BE}$ volts before transistors T1 and T3 are turned on. This problem is aggravated, in some applications, by the need to make resistor R1 a high impedance element in order to decrease the power dissipation of the circuit. Another drawback of the circuit of FIG. 1 is that the response time of the circuit varies depending on the elapsed time between a high-to-low (turn-off) transition of the input signal and a subsequent low-to-high (turn-on) transition of the input signal. As shown in waveform C of FIG. 3, the potential at the base of transistor T1, though initially driven to zero volts may charge back up to $V_{BE}$ volts due to the collector-to-base leakage current of transistor T1. The leakage current may be extremely small and may be insufficient to cause substantial conduction in transistor T1. However, it is sufficient to recharge the potential level at node A. As a result, as recognized by Applicants, due to the capacitive coupling of the turn off signal to the base of transistor T1, its base voltage can be anywhere within the range of zero volts to $V_{BE}$ volts following turn off. (Note that due to resistor R3 connected between its emitter and ground, transistor T1 conducts base-to-emitter current when its base voltage reaches $V_{BE}$ volts. However, transistor T1 and T3 do not conduct until the base voltage of T1 reaches 2$V_{BE}$ volts). As may be deduced from waveform C of FIG. 3, the response time of the circuit varies depending on whether a turn-on signal is applied to the circuit at time $t_0$, $t_1$, $t_2$, or $t_3$. The response time is, therefore, not repeatable or predictable.

It is desirable to have high noise immunity, low power consumption circuits having predictable and repeatable characteristics, with relatively quick response times, and which are simple so that they can be mass produced with high yields and at relatively low cost.

The invention also resides in means responsive to the turn-off signal applied to the base of a transistor for preventing the forward bias between the base and emitter of the transistor from being decreased below a predetermined level when the transistor is being turned off. In circuits embodying the invention, at least one PN junction is connected between a first node and the base of a transistor whose emitter is coupled to a point of fixed potential. The PN junction and the base-to-emitter region of the transistor are poled to conduct in the same forward direction. A turn off signal transition, applied to the first node, having sufficient polarity and amplitude to reverse bias the PN junction is coupled through the capacitance of the PN junction to the base of the transistor. A unidirectional conducting means is connected between a point of bias potential and the base of the transistor. In response to the turn off signal at the base, the unidirectional conducting means conducts in its forward, low impedance, direction and prevents the base-to-emitter voltage of the transistor from going substantially below the turn-on level of the transistor. As a result, the delay time of the transistor, in response to a subsequent turn-on signal at the first node, is decreased. The circuit shown in dashed box 30 of FIG. 2 is similar to that of FIG. 1 except that: (a) the utilization device 19 of FIG. 1 is replaced by transistor T2, diode D4 and resistor R4. Transistor T2 is connected at its base to the collector of transistor T1 at its collector via resistor R4 to conductor 16, and at its emitter via diode D4 to the collector of transistor T3; (b) the collector of transistor T3 is connected to output terminal 20; (c) an additional Schottky diode D2 is connected between nodes 14 and 12; and (d) diode D3 is replaced by element D31 comprising a transistor connected at its base to node 14 and at its collector and emitter to node A. Thus two PN junctions are connected in parallel between nodes 14 and A. Transistor D31 is connected as a diode and for ease of description will be referred to in the description to follow and in the claims appended hereto, as a diode or as a PN junction. In this arrangement, the collector-to-base capacitance and the emitter-to-base capacitance of element D31 are connected in parallel to increase the capacitance between nodes 14 and A. When element D31 is reverse biased or is being reverse biased, the additional capacitance between nodes A and 14 ensures that a negative transition at node 14 is coupled to node A with little attenuation.

In the circuit of FIG. 2, a bias circuit is provided which includes a resistor R21 connected between conductor 16 and node 22. Two Schottky diodes, D51 and D52 are connected in series between node 22 and conductor 18 and are poled to conduct current in the forward direction from node 22 into conductor 18. A schottky diode D53 is connected at its anode to node 22 and at its cathode to node A.

In the operation of the circuit of FIG. 2 diodes D51 and D52 provide a potential at node 22 which is equal to the sum of the forward voltage drops of diodes D51 and D52. Thus, the potential at node 22 is equal to two times $V_{FS}$. Diode D53 couples the potential at node 22 to junction A. When the potential at node A exceeds $V_{FS}$ volts, diode D53 is non-conducting or reverse biased and presents a relatively high impedance to node A. Thus, in essence, when the potential at node A is greater than $V_{FS}$, the biasing network has little if any effect on the circuit operation. Accordingly, as for the circuit of FIG. 1, when the input signals applied to terminals 10 and 12 are both high, the potential at node 14 is at $3V_{BE}$ volts and the potential at node A is at $2V_{BE}$ volts. Current flows from conductor 16 through resistor R1 and through diode D31 into the base of phase splitting transistor T1. Transistor T1 conducts causing the potential at its collector and at the base of transistor T2 to decrease sufficiently to turn off transistor T2. The emitter current of transistor T1 is supplied to the base of transistor T3, driving it into hard saturation and thereby causing the potential at output terminal 20 to be clamped close to ground potential.

When one, or both, of the input signals applied to terminals 10 and 12 makes a negative going transition, the potential at terminal 10 or 12 goes to a low value which may be assumed to be 0.25 volt. Diodes D1 and/or D2 clamp node 14 to 0.8 volt due to the $V_{FS}$ drop ( $\approx$ 0.55 volt) across this diode. This is substantially equal to the value of one $V_{BE}$ drop. As the potential at node 14 drops from $3V_{BE}$ volts to $V_{BE}$ volts, diode D31 becomes reverse biased and the negative transition is coupled through its capacitance to node A and cuts off transistor T1. The potential at node A can, theoretically, go from $2V_{BE}$ volts to zero volts. However, as soon as the potential at A starts going below $V_{FS}$ volts, diode D53, which clamps node A to node 22, conducts in the forward direction and holds the potential at $V_{FS}$ volts. The potential at node 22 is equal to $2V_{FS}$, but due to the forward voltage drop across diode D53, the potential at node A is held at $V_{FS}$ volts. Thus, the effect of the turn on of diode D53 is to prevent the potential at node A from going below $V_{FS}$. Since $V_{FS}$ is below the turn on point of transistor T1, this transistor remains cut off. Since transistor T1 no longer supplies current to the base of transistor T3, it is also cut off. Current flows from conductor 16 and through resistor R2 into the base of transistor T2, turning it on. The potential at output 20 goes high, towards $+V_{CC}$ volts, by conduction through resistor R4, the collector-to-emitter of transistor T2 and diode D4.

Figure 3:
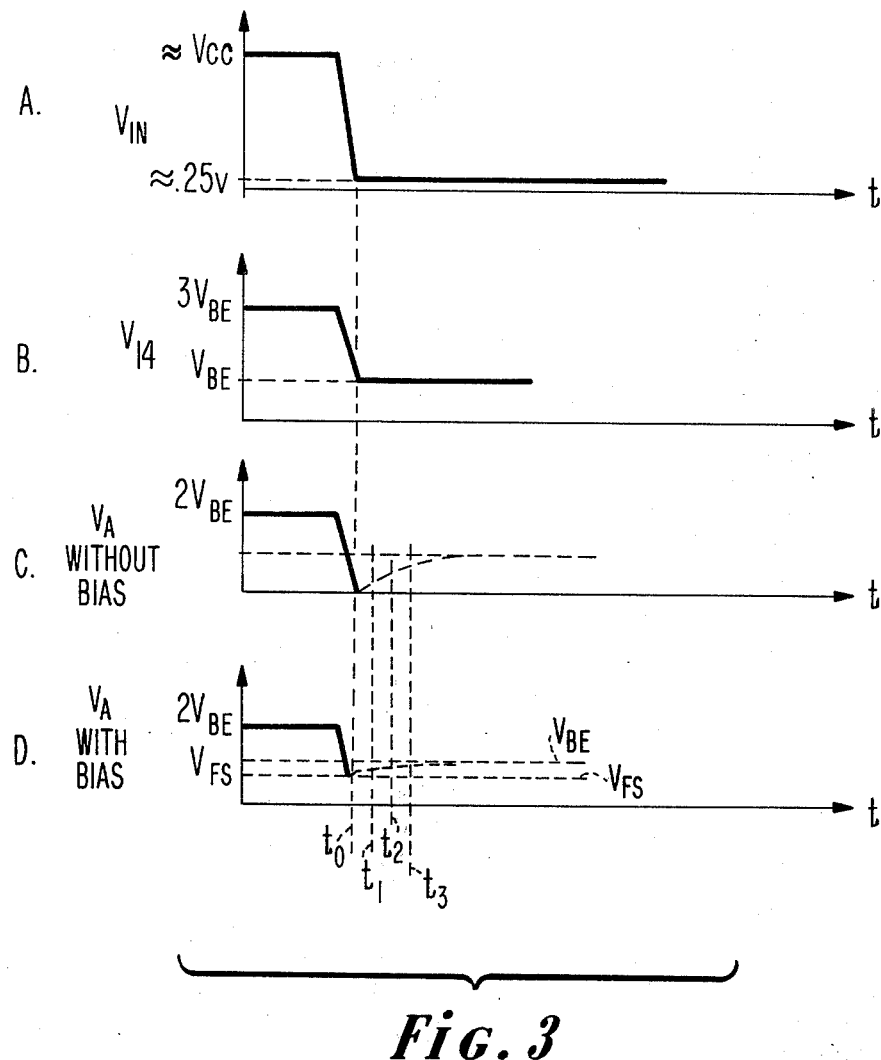
FIG. 3 is a diagram of waveforms of the voltages at various nodes of FIGS. 1 and 2.

As shown in waveform D of FIG. 3, the lowest potential at node A is $V_{FS}$ volts. Clearly, by use of the biasing clamp the time it takes node A to charge up to $2V_{BE}$, in response to a subsequent turn-on pulse, is decreased and consequently the turn-on delay of the circuit is significantly decreased. Furthermore, the range of the potential at the base of transistor T1 at any time after cut off can only be in the range of $V_{FS}$ to $V_{BE}$ volts. For the values assumed above, the range is between 0.55 volt and 0.8 volt. The variations in response time for the circuit of FIG. 2, compared to that of FIG. 1, is significantly reduced and the variations from circuit to circuit will be much more constant.

It should be noted that the speed of response of the circuit has been increased without degrading the noise immunity of the circuit. Applying a slight forward bias to internal node A of the circuit does not alter the need for the potential at node 14 to rise to $3V_{BE}$ volts before transistors T1 and T3 are turned on.

Circuits embodying the invention include a source of direct current (dc) bias (R21, D51, D52) and a unidirectionally conducting element (D53) coupling the dc bias to the base of a transistor (T1). For one signal condition, the unidirectionally conducting element has a low forward impedance and functions to clamp the base of the transistor to a given voltage level. For another signal condition the unidirectional element has a high back impedance, thereby isolating the base of the transistor from the source of dc bias.

When the unidirectional element (D53) conducts in the forward direction, in response to a turn-off transistor, the offset PN junction (D31) is reverse biased and isolates the base of transistor T1 from node 14 and the low input signals applied to terminals 10 and/or 12. When element D31 conducts in the forward direction, in response to a turn-on signal, diode D53 is reverse biased and isolates node 22 from the base of transistor T1. Thus, the input signal and the dc bias source do not load one another. The unidirectional element shown in FIG. 2 is a Schottky barrier diode, but any rectifying junction could be used instead.

Due to the presence of resistor R3 connected between the emitter of transistor T1 and ground, transistor T1 begins to conduct base-to-emitter current when its base voltage reaches approximately $V_{BE}$ volts (0.8 volt). Accordingly, in the circuit of FIG. 2, a bias of $V_{FS}$ (0.55 volt) which is somewhat less than $V_{BE}$ (0.8 volt, is applied to the base of transistor T1. If the turn on voltage of transistor T1 were higher (e.g. if resistor R3 were removed) a higher bias potential could be applied to its base. In general, the dc bias at node 22 can be raised or lowered by the addition or removal of one or more diodes. Also these diodes could be Schottky or conventional diodes. The bias voltage at node 22 could even be raised or lowered by varying the value of the biasing resistor R21, although this means of varying the bias potential is not very exact.

As shown in FIG. 2, a single bias circuit may be used to provide the bias to more than one switching circuit. Node 22 may be coupled by means of diodes D53a and D53b to nodes Aa and Ab, respectively, of circuits 30a and 30b, respectively; where circuits 30a or 30b are similar to the circuit shown in box 30.

The invention has been illustrated using NPN transistors. But, it should be evident that PNP transistors could be used instead with due care to arrange the diodes and the polarity of the power supply for proper operation of the circuit.

The circuit of FIG. 1 has been used to illustrate the problem faced by Applicant. But it should be understood that the problem and the solution are applicable to any transistor circuit in which a turn off signal is coupled to the base of the transistor through the capacitance of a reverse biased junction.

What is claimed is:

1. In a circuit including a transistor whose emitter is coupled to a point of fixed potential and a PN junction, which exhibits capacitance when reverse biased, connected between a first node and the base of said transistor and being poled so that its forward direction is the same as the forward direction of the base-to-emitter region of said transistor, and wherein in response to a turn-off signal transition at said first node, having sufficient amplitude and polarity to reverse bias said PN junction, said transition is coupled through the capacitance of said PN junction to the base of said transistor and turns it off;

the improvement comprising:
a source of potential; and
a unidirectional conducting means, connected between said source of potential and the base of said transistor, poled in a direction to couple said potential source to said base through a relatively low impedance in response to said turn-off signal transition, for preventing the forward bias between the base-and-emitter of said transistor from decreasing below a predetermined level, where said predetermined level is less than the turn-on point of said transistor; and said unidirectional conducting means being rendered non-conductive and isolating said base from said source of potential in response to a turn-on signal at said first node.

2. The improvement as claimed in claim 1, wherein said unidirectional means is a diode poled to conduct in the same forward direction as the base-to-emitter junction of said transistor; and wherein said source of potential has a polarity and an amplitude to forward bias the base-to-emitter of said transistor.

3. The combination comprising:
a transistor having a collector, a base, and an emitter;
a PN junction exhibiting a low forward voltage drop when forward biased and capacitance when reverse biased;
means coupling the emitter of said transistor to a first point of operating potential and means coupling the collector of said transistor to a second point of operating potential;
a first node;
means connecting said PN junction between said first node and the base of said transistor, said PN junction and the base-to-emitter region of said transistor being poled to conduct in the same forward direction;
means coupled to said first node for selectively applying thereto a turn-off signal whose transition from a first level to a second level is of sufficient amplitude and polarity to reverse bias said PN junction, said transition being coupled through the capacitance of the PN junction to the base of the transistor for turning off the transistor;
a direct current (dc) bias source of potential having a polarity to forward bias said transistor; and
a unidirectional conducting element connected between said bias source and the base of said transistor and responsive to the turn-off potential at said base for coupling said base to said source of potential through a low impedance path and preventing the forward bias potential between the base-and-emitter from decreasing substantially below the turn-on point of said transistor.

4. The combination as claimed in claim 3, wherein said PN junction comprises a transistor having its collector and emitter connected to the base of the said transistor and its base connected to said first node.

5. The combination as claimed in claim 3, wherein said bias source of potential includes a resistance means connected in series with one or more diodes between said first and second points of operating potential;
wherein said unidirectional element is connected between the base of said transistor and the anode or cathode of one of said one or more diodes of said bias source; and
wherein said unidirectional conducting element is a diode.

6. The combination as claimed in claim 3, wherein said means coupling the emitter of said transistor to said first point of potential includes a second transistor, connected at its base to the emitter of said transistor and at its emitter to said first point of potential;

wherein said means coupling the collector of said transistor to said second point of potential includes, a resistance connected between the collector of said transistor and said second point of potential, and a third transistor connected at its base to the collector of said transistor and at its emitter to said second point of potential; and further including means connecting the collectors of said second and third transistors to an output terminal.

7. The combination as claimed in claim 6, wherein said means for applying a signal to said first node includes, at least, one input diode connected between said first node and a signal input point, said input diode being poled in the opposite direction to that of said PN junction.

8. The combination as claimed in claim 6 wherein said unidirectional element is a diode poled to conduct in the same direction as said PN junction;

wherein, in response to a turn-off signal at said first node, said PN junction is driven in the reverse direction and said unidirectional element conducts in the forward direction; and wherein in response to a turn-on signal at said first node said PN junction is driven in the forward direction and said unidirectional element is reverse biased.

* * * * *